United States Patent
Owens

(10) Patent No.: US 8,704,409 B2
(45) Date of Patent: Apr. 22, 2014

(54) HIGH SPEED SOLID-STATE RELAY WITH CONTROLLER

(75) Inventor: Jason Owens, Toledo, OH (US)

(73) Assignee: Zhiwei Chen, Toledo, OH (US)

( * ) Notice: Subject to any disclaimer, the term of this patent is extended or adjusted under 35 U.S.C. 154(b) by 758 days.

(21) Appl. No.: 12/912,880

(22) Filed: Oct. 27, 2010

(65) Prior Publication Data

US 2011/0096451 A1    Apr. 28, 2011

Related U.S. Application Data

(60) Provisional application No. 61/255,637, filed on Oct. 28, 2009.

(51) Int. Cl.
   *H01H 47/00* (2006.01)
   *H01H 83/00* (2006.01)
   *H02J 7/00* (2006.01)

(52) U.S. Cl.
   USPC .......................................................... 307/125

(58) Field of Classification Search
   USPC .................................................. 307/116, 125
   See application file for complete search history.

(56) References Cited

U.S. PATENT DOCUMENTS

| | | | |
|---|---|---|---|
| 2007/0262652 A1* | 11/2007 | Kilroy | 307/116 |
| 2010/0024457 A1* | 2/2010 | Adachi et al. | 62/230 |
| 2013/0088162 A1* | 4/2013 | Langovsky | 315/201 |

* cited by examiner

*Primary Examiner* — Carlos Amaya
(74) *Attorney, Agent, or Firm* — Fraser Clemens Martin & Miller LLC; J. Douglas Miller

(57) ABSTRACT

A relay and a controller for the same are disclosed. The relay includes an isolated power supply configured to receive a voltage input and generate a voltage output based upon the voltage input, an isolator configured to receive an input signal and generate an isolated output signal based upon the input signal, at least one switch, and a driver in electrical communication with the isolated power supply, the isolator, and the at least one switch for controlling the at least one switch in response to the isolated output signal, wherein the driver receives the voltage output from the isolated power supply as an operating voltage. The controller is in signal communication with the isolator to generate and transmit the input signal thereto.

20 Claims, 3 Drawing Sheets

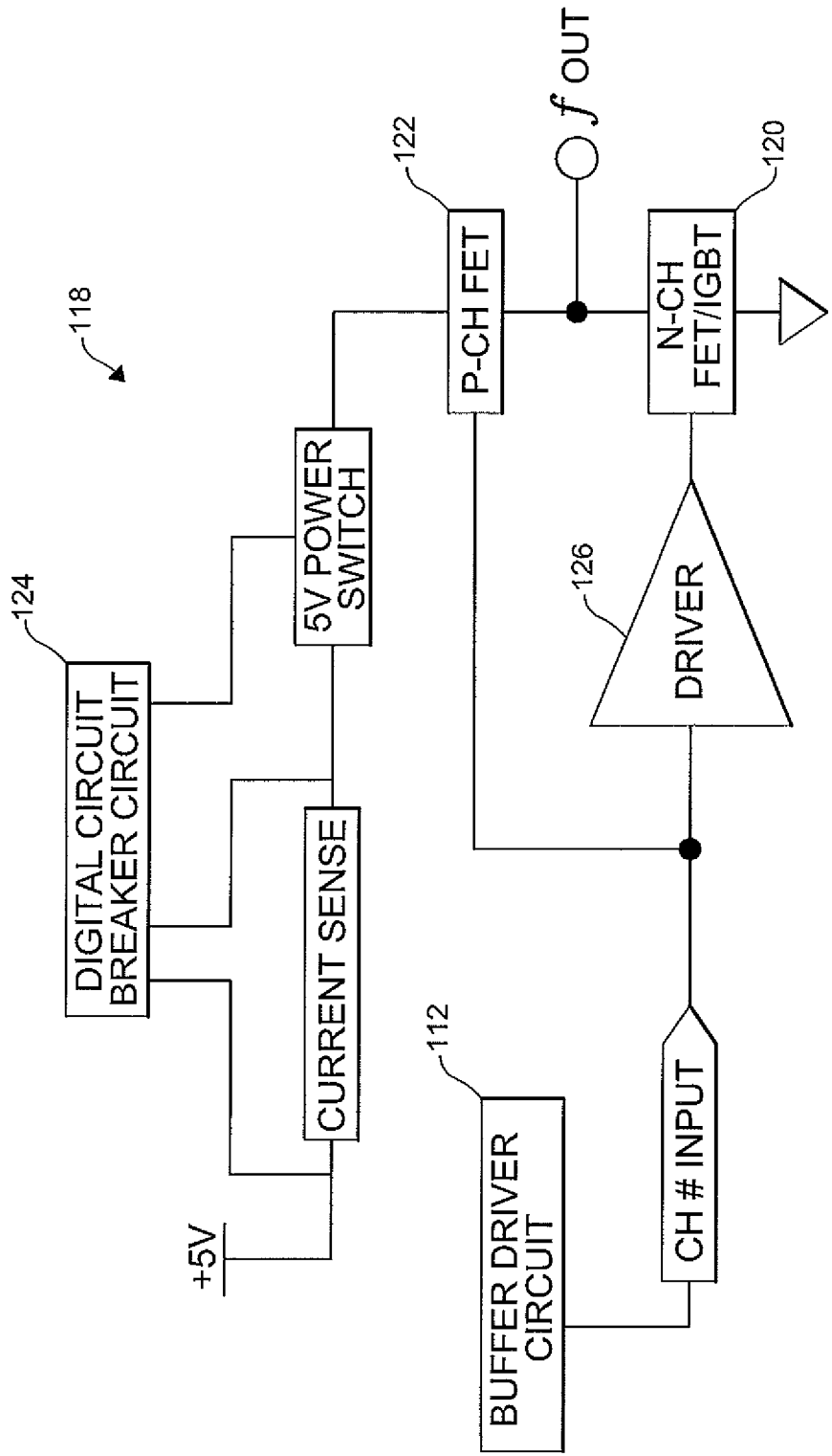

HIGH SPEED SOLID-STATE RELAY WITH CONTROLLER

CROSS-REFERENCE TO RELATED APPLICATION

This application claims the benefit of U.S. Provisional Patent Application No. 61/255,637 filed on Oct. 28, 2009, the entire disclosure of which is incorporated herein by reference.

FIELD OF THE INVENTION

The present invention relates generally to relays and controllers for the same. More particularly, the invention is directed to a solid-state relay which can switch a load at high-frequencies (i.e. switching repetition rates) and a controller for the same.

BACKGROUND OF THE INVENTION

Electromechanical relays are the standard means for switching high frequency (e.g., >1 MHz) signals, such as T1 or DS1 (1.544 Mbit/sec) carrier signals. Two advantages electromechanical relays have over solid-state relays are the lower ON resistance (when the relay contacts are closed) and higher isolation (when the contacts are open) at high frequencies. However, electromechanical relays are large, noisy, require relatively large power to operate, and are slow to operate, compared to solid-state relays. Additionally, conventional electromechanical relays are not practical for applications that require high voltage switching at high repetition rates such as power electronics, for example.

It would be desirable to develop a solid-state relay and a controller for the same, wherein the solid state relay is capable of: switching high-frequency signals; switching at high speed; and switching high voltage inputs at high repetition rates.

SUMMARY OF THE INVENTION

Concordant and consistent with the present invention, a solid-state relay and a controller for the same, wherein the solid state relay is capable of: switching high-frequency signals; switching at high speed; and switching high voltage inputs at high repetition rates, has surprisingly been discovered.

In one embodiment, a relay device comprises: an isolated power supply configured to receive a voltage input and generate a voltage output based upon the voltage input; an isolator configured to receive an input signal and generate an isolated output signal based upon the input signal; at least one switch; and a driver in electrical communication with the isolated power supply, the isolator, and the at least one switch for controlling the at least one switch in response to the isolated output signal, wherein the driver receives the voltage output from the isolated power supply as an operating voltage.

In another embodiment, a multi-channel pulse controller comprises: an output stage in signal communication with at least one of the channels of the controller, the output stage including at least a pair of transistors to selectively operate in at least a relay mode and a logic mode; a microcontroller having at least one pulse width modulator in signal communication with the output stage to generate at least one output pulse and transmit the at least one output pulse to the output stage; a buffer circuit in signal communication with the output stage and the microcontroller to provide electrical protection between the output stage and the microcontroller; and a kill switch circuit in signal communication with the buffer circuit to selectively prevent the buffer circuit from passing the at least one output pulse from the microcontroller to the output stage.

In yet another embodiment, a relay device comprises: an isolated power supply configured to receive a voltage input and generate a voltage output based upon the voltage input; an isolator configured to receive an input signal and generate an isolated output signal based upon the input signal; at least one switch; a driver in electrical communication with the isolated power supply, the isolator, and the at least one switch for controlling the at least one switch in response to the isolated output signal, wherein the driver receives the voltage output from the isolated power supply as an operating voltage; and a controller in signal communication with the isolator to generate and transmit the input signal thereto, the controller further comprising: an output stage including at least a pair of transistors to generate the input signal; and a microcontroller having at least one pulse width modulator in signal communication with the output stage to generate at least one output pulse and transmit the at least one output pulse to the output stage to control at least one of the pair of transistors.

BRIEF DESCRIPTION OF THE DRAWINGS

The above, as well as other advantages of the present invention, will become readily apparent to those skilled in the art from the following detailed description of the preferred embodiment when considered in the light of the accompanying drawings in which:

FIG. 3 is a schematic diagram of an output stage for a single channel of the controller of FIG. 2, according to an embodiment of the present invention.

DETAILED DESCRIPTION OF EXEMPLARY EMBODIMENTS OF THE INVENTION

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

Figure 1:
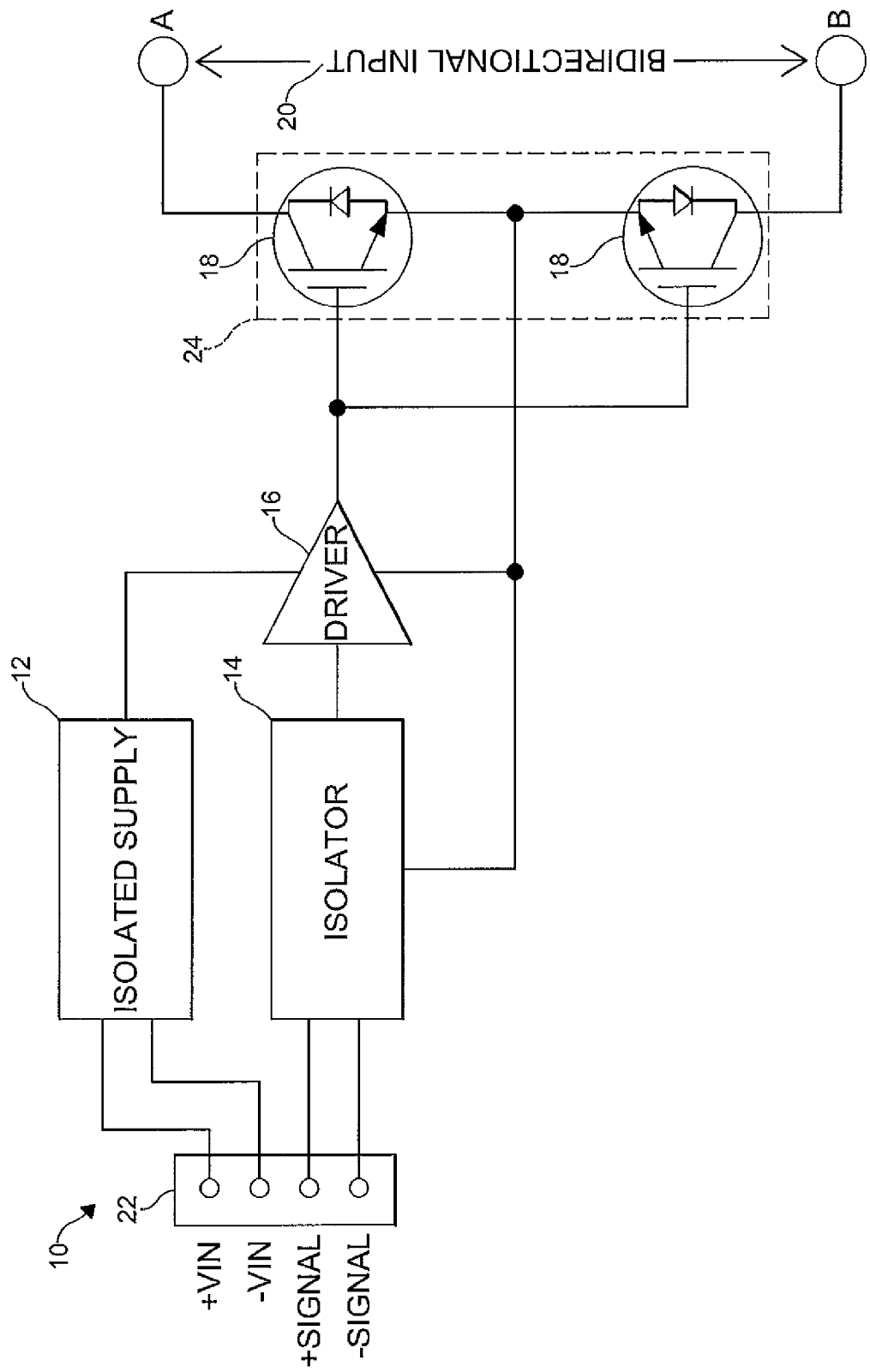
FIG. 1 is a schematic diagram of a solid-state relay according to an embodiment of the present invention.

FIG. 1 illustrates a solid-state relay 10 according to an embodiment of the present invention. As shown, the relay 10 includes an isolated power supply 12, an isolator 14, a driver 16, a plurality of transistors 18 (e.g. socketed transistors), and an input 20.

The isolated power supply 12 is an isolated direct current to direct current (DC/DC) converter such as a D200ERW series converter manufactured by MicroPower Direct, LLC. However, other devices having similar functionality can be used. The isolated power supply 12 is electrically coupled to a Vin+ and a Vin− disposed on a header receptacle 22 or electrical connecter. An isolated output of the isolated power supply 12 is in electrical communication with at least one of the isolator 14 and the driver 16. It is understood that a voltage regulator (not shown) may be disposed intermediate the isolated power supply 12 and at least one of the isolator 14 and the driver 16.

The isolator 14 is a photocoupler such as a PC911L0NSZ0F series manufactured by the Sharp Corporation. However, other devices having similar functionality such as capacitive or giant magnetostriction (GMR) isolators may be used. The isolator 14 is in electrical communication with the header receptacle 22 to receive an input signal. In this way, the input signal is electrically isolated from an output signal of the isolator 14 that is transmitted to an input of the driver 16.

The driver 16 is typically a transistor driver such as a MIC4451 series manufactured by Micrel, Inc. However, other devices having similar functionality may be used. The driver 16 is in electrical communication with the isolator 14 to receive an isolated signal at the input of thereof. An output of the driver 16 is electrically coupled to a gate of each of the transistors 18 to control a "switching" thereof.

The transistors 18 are one of an insulated-gate bipolar transistor (IGBT) and a metal-oxide-semiconductor field-effect transistor (MOSFET) releaseably packaged in transistor sockets for convenient replacement and can be substituted with a variety of IGBTs or MOSFETs with comparable characteristics.

As a non-limiting example, the following tables of MOSFETs and IGBTs may be used:

| Part Number | Voltage | Current | Gate Capacitance | On Resistance |
|---|---|---|---|---|
| MOSFETs | | | | |
| STP16NF06 | 60 V | 16 A | 315 pF | 0.1 Ω |
| IRF820A | 500 V | 2.5 A | 340 pF | 3 Ω |
| IRF840 | 500 V | 8 A | 1300 pF | 0.75 Ω |
| STP2NK60Z | 600 V | 1.4 A | 170 pF | 7.2 Ω |
| SPA02N80C3 | 800 V | 2 A | 290 pF | 2.7 Ω |
| STP5NK100Z | 1000 V | 3.5 A | 1154 pF | 2.7 Ω |
| STP4N150 | 1500 V | 4 A | 1300 pF | <7 Ω |
| IGBTs | | | | |
| STGF3NC120HD | 1200 V | 3 A | 470 pF | ~0.73 Ω @ 3 A |
| IRGB5B120KD | 1200 V | 6 A | 370 pF | ~0.6 Ω @ 6 A |

It is understood that other transistors may be used. As noted above, it is possible to optimize the maximum operating frequency and power consumption of the relay 10 by choosing an IGBT or MOSFET with the lowest gate capacitance. If the maximum operating voltage is not of great concern, the user may use other lower-voltage MOSFETs to operate the switch at higher frequencies without over-burdening the power supply.

The input 20 is a bi-directional input adapted to be coupled with a source signal to control a switching or pulsing thereof. However, it is understood that the input 20 can be included as part of power electronics circuit for switching power loads. If a user desires to use an 1 GBT which does not contain a body diode, the relay 10 can be operated as a unidirectional switch by removing one of the transistors 18 and shorting the unused transistor socket.

In certain embodiments, the relay 10 includes a heatsink 24 (e.g. having a thermal resistance of about 3.7° C./W) in thermal communication with at least one of the transistors 18 to maximize heat dissipation from the at least one of the transistors 18. In certain embodiments, the driver 16 is also equipped with a dual in-line package (DIP) cooler heatsink (not shown) which has a thermal resistance of 30° C./W. However, larger heatsinks with a higher thermal conductivity can be used. For higher frequencies, a light airflow is recommended to keep the driver 16 from overheating. In most cases, the heatsink 24 can regulate a temperature of the transistors 18. However, it is understood that a user can use the thermal resistance of the heatsink 24 and the anticipated switch power dissipation to determine if additional airflow cooling is necessary.

In use, the relay 10 operates as a switch for switching applications requiring high voltage and low current loads. The transistors 18 enable the relay 10 to act as a bidirectional, isolated relay with a standoff voltage of 1200V. The on-board driver 16, the isolator 14, and the isolated power supply 12 (DC-DC converter chip) are all protected against high voltage transients if one or both of the transistors 18 should fail. In certain embodiments, the power and signal inputs are protected with an input diode (not shown) to guard against improper input polarities. Typically, a power supply input of the header receptacle 22 can withstand −40V and the signal input of the header receptacle 22 can withstand up to −100V. However, other voltages may be used.

In certain embodiments, the relay 10 generally performs according to following parameters:

| Parameter | Test Conditions | Min | Typ | Max | Units |
|---|---|---|---|---|---|
| Supply Voltage | $f_{in} = 0$ Hz | 8 | 12 | 18 | V |
| Supply Current | $0$ Hz ≤ $f_{in}$ ≤ 2 MHz, $V_{in} = 12$ V | 50 | | 230 | mA |
| Supply Isolation Voltage | | 1.5 | | | kV |
| Input Logic High | $V_{in} = 12$ V | 2.8 | 5 | 15 | V |
| Input Logic Low | $V_{in} = 12$ V | 0 | 0 | 2.7 | V |
| Logic Input Isolation Voltage | | | 5 | | kV |
| Operating Frequency Range | $V_{in} = 12$ V | 0 | | 2 | MHz |
| Minimum Pulse Width | | 60 | | | ns |
| Operating Temperature | | −40 | 20 | 85 | ° C. |
| Output Switching Time | $8$ V ≤ Vin ≤15 V | | 6 | | ns |
| Switch Voltage | | | | 1500 | V |
| Switch Current (Continuous) | | 0 | | 4 | A |
| Switch Current (Pulsed) | | | 10 | 30 | A |

With regard to the above table, switching times are dependent on the load current and impedance. (Stated switching speed is based on prototype test with the STGF3NC120HD 1200V IGBTs). Maximum voltage is determined by the IGBT/MOSFET used. Typically, 1200V IGBTs are used, thereby providing a 1200V standoff limit. As such, a maximum recommended voltage is 1500V. However, higher voltages may be used with other transistor combinations. The pulsed current is highly dependent on the transistor used. For the typical 1200V IGBTs, the maximum pulsed current is 10 A. However, the circuit board can withstand currents as high as 30 A for short periods of time. It is understood that a user can observe trace and switch temperatures to empirically determine maximum allowable pulsed current. It is further understood that frequencies higher than 2 MHz can be achieved if IGBTs or MOSFETs with lower gate capacitances are used.

Figure 2:
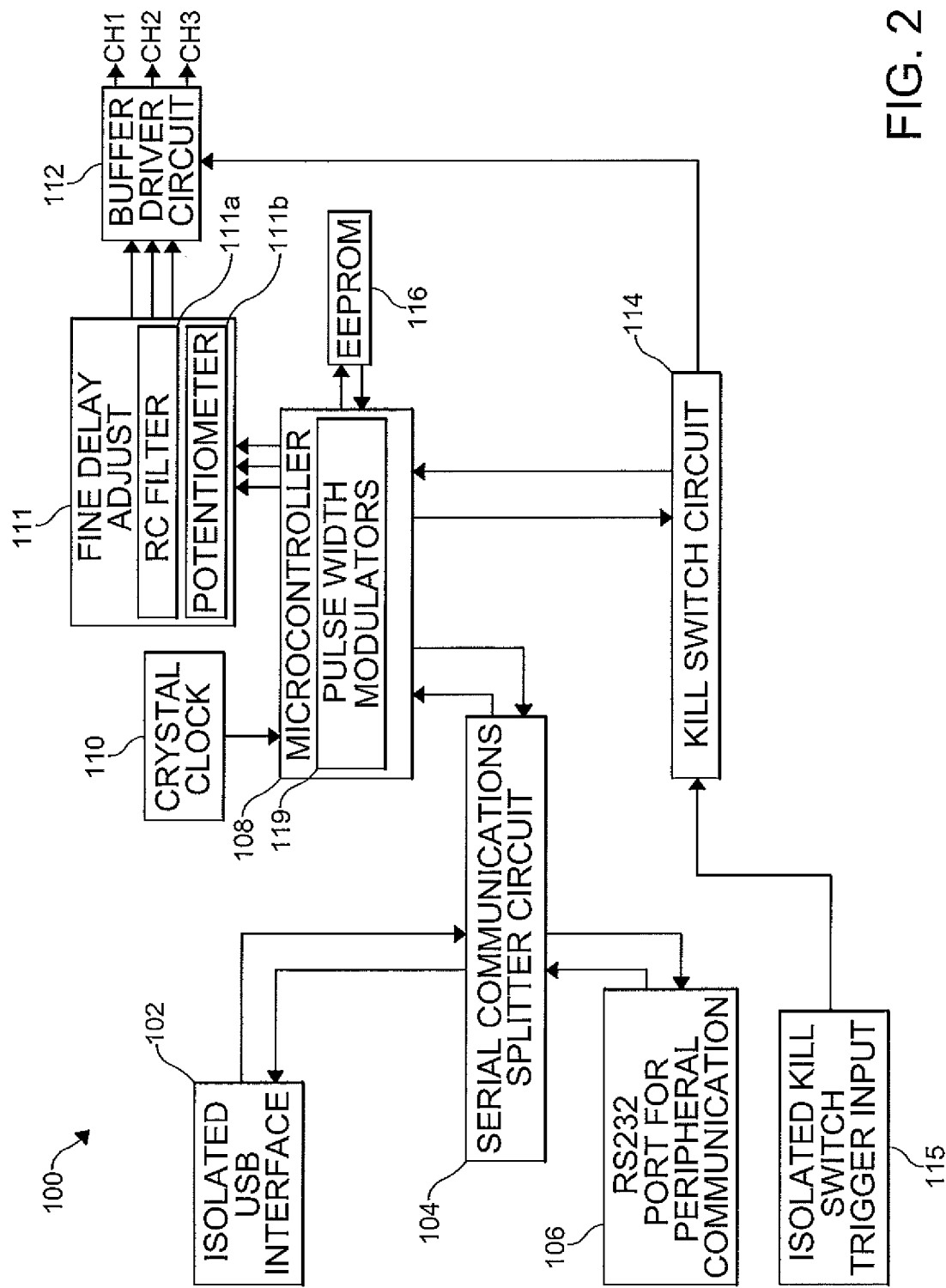
FIG. 2 is a schematic block diagram of a three-channel pulse controller according to an embodiment of the present invention.

FIG. 2 illustrates a multi-channel (e.g. three channel) pulse controller 100 according to an embodiment of the present invention. However, any number of channels can be included. As shown, the controller 100 includes an isolated universal serial bus (USB) Interface 102, a serial communications splitter circuit 104, an RS232 Port 106 (e.g. auxiliary (AUX)), a microcontroller 108, a crystal clock 110, a fine delay adjust 111, a buffer driver circuit 112, a kill switch circuit 114, and a memory chip 116. As a non-limiting example, the controller 100 is in electrical communication with the relay 10 to provide the input signal to the header receptacle 22 of the relay 10. However, other devices can be controlled by the controller 100.

The isolated USB interface 102 includes at least two high-speed optocouplers capable of passing data at up to 3 MBaud. However, any interface having any transfer rate can be used. An isolation barrier of the interface 102 is adapted to withstand at least 1000V potential difference between a circuit board and an external USB hub or computer connected to the controller 100. In the event of a catastrophic failure of the output stage via electrostatic discharge (ESD) or other high voltage transient, the components of the controller 100 are protected from damage.

The serial communications splitter circuit 104 is in communication with the microcontroller 108 and at least one of the isolated USB interface 102 and the RS232 port 106 to provide a three-way, bidirectional communication therebetween. In certain embodiments, the splitter circuit 104 includes three OR gates and two inverters to perform the necessary splitting/joining and inversion of the incoming and outgoing Transmit (TX) and Receive (RX) lines, which connect the microcontroller 108 to the isolated USB interface 102 and the auxiliary RS232 port 106 communications port to allow communication with peripheral devices (not shown).

The auxiliary RS232 port 106 is a circuit including a differential line driver integrated circuit (IC) and wires for sourcing power and ground to an external module. The auxiliary RS232 port 106 is adapted to receive a standard CAT5 network cable to maintain signal integrity over fairly long distances in noisy environments. In certain embodiments, the auxiliary RS232 port 106 may be implemented using a wireless module such as a Bluetooth® module, a Wifi® module, an Infrared Data Association (IrDA) module or other standardized wireless protocol in place of the differential line driver and cable. It is understood that the auxiliary RS232 port 106 accommodates any peripherals to communicate with the controller 100.

In certain embodiments, the microcontroller 108 is used to generate a plurality of output pulses through at least one of a plurality of channels to drive an output stage 118 (See FIG. 3). In the embodiment shown, the microcontroller 108 has three distinct output channels. However, any number of channels can be used. The microcontroller 108 is also configured to manage communications with a PC software application and any externally connected peripherals. As a non-limiting example, the microcontroller 108 is a dsPIC30F2020 (a Switched mode power supply (SPMS) PIC microcontroller) having four high-speed hardware pulse width modulators (PWM) 119. The PWMs 119 are configured as pulse frequency generators and have a total output bandwidth of about 14 kHz to about 5 MHz. In order for the controller 100 to operate at frequencies below 14 kHz, a software PWM is also programmed, which can be used in place of the hardware PWMs 119 when lower frequencies are desired. In certain embodiments, the microcontroller 108 includes an integrated internal frequency multiplying internal phase locked loop (PLL) (not shown).

In certain embodiments, a direct digital synthesis (DDS) chip (not shown) is used to generate high resolution output frequencies, and an external pulse width (one-shot) chip is used to set a pulse width of the output pulses. The controller 100 also has the capability of outputting a sine wave, a sawtooth wave, square wave, and a ramp waveform. It is understood for the sine and the sawtooth output, a separate analog output stage including a plurality of power op-amps can be implemented along with the switching output stage 118 for the output pulses.

The crystal clock 110 (e.g. oscillator) is in communication with the microcontroller 108 and is trimmed to within 50 ppm accuracy. Combined with the internal frequency multiplying internal phase locked loop (PLL) integrated into the microcontroller 108, the crystal clock 110 allows the output pulses to have a stability of 0.001 Hz at the maximum programmed output frequency 5 MHz.

The fine delay adjustment circuit 111 is used to increase the phase resolution of the output pulses generated by the microcontroller 108. By itself, the microcontroller 108 is capable of producing a minimum phase shift of 4.2 ns between the output pulses through any particular channel. However, the fine delay adjustment circuit 111 is implemented as an external phase "fine tuning" circuit to increase the phase resolution to less than 1 ns. As a non-limiting example, the fine delay adjustment circuit 111 includes an RC filter 111a (e.g. delay filter) and a programmable potentiometer chip 111b which are configured with an input capacitance of the buffer driver circuit 112. In this way, the maximum R value of the potentiometer chip 111b can be used to set a range of a tuning delay. It is understood that the fine delay adjustment circuit 111 can be used to compensate for cable and trace length differences in applications where phase delay is critical.

The buffer driver circuit 112 includes a Hex buffer driver chip to fulfill at least the following functions:
 a) serve as a buffer between an output of the microcontroller 108 and inputs of the output stage 118, thereby providing a layer of protection for the microcontroller 108 in the event of a catastrophic failure of the output stage 118 or any other transient event that could compromise the integrity of the output stage 118 (e.g. transistors and driver circuitry);
 b) provide an input capacitance for the RC filter 111a used to tune the fine delay adjustment circuit 111; and
 c) provide an independent cutoff point of the output signals for the kill switch circuit 114.

The kill switch circuit 114 is a hardware-level safety feature that can operate independent of the microcontroller 108. The kill switch circuit 114 functions to cutoff the output pulses when a fault signal is received from an isolated kill switch trigger input 115.

The isolated kill switch trigger input 115 is typically an optocoupler that can accept a sensor input voltage from 3-18V. Once triggered to an "ON" state, a signal toggles a flip-flop and surrounding logic to toggle the kill switch circuit 114 into a fault state. In the fault state, the output pulses that are feeding through the buffer driver circuit 112 are halted, thus preventing the pulse signals from reaching the output stage 118. A fault signal is also routed to the microcontroller 108 to indicate a change in the fault state of the kill switch circuit 114. Where the microcontroller 108 is responsive to the fault signal, the microcontroller 108 halts the output pulses (e.g. the outputs of each of the PWMs 119, internally. However, the kill switch circuit 114 provides a layer of redundancy by stopping the output pulses at the buffer driver circuit 112 in the event that the microcontroller 108 should hang or malfunction. In certain embodiments, the kill switch circuit 114 can be manually reset by pressing a button on the exterior of the controller 100 or can be software reset by the microcontroller 108. However, if the fault signal is still asserted on the isolated input, the kill switch circuit 114 will remain active until the input signal applied to the isolated kill switch trigger input 115 is deserted. Logic is also provided to completely disable the kill switch circuit 114 from cutting the outputs from the controller 100. It is understood that the control of the fault state and reset can be controlled by the microcontroller 108 as a software setting.

The memory chip 116 is an Electrically Erasable Programmable Read-Only Memory (EEPROM) chip for storing settings and other general-purpose data. The memory chip 116 stores frequency and mode settings that can be reloaded on startup. For example, the memory chip 116 can store a frequency, a pulse width, a phase, a program setting, a user setting, a custom pulse scheme, and arbitrary waveform output data.

FIG. 3 illustrates the output stage 118 for a single channel of the controller 100. The output stage 118 for each of the three channels is identical. The output stage 118 includes an N-Channel power MOSFET 120 or IGBT and a lower power P-Channel MOSFET 122. As a non-limiting example, the output stage 118 is capable of operation in two modes. In the first mode, "Relay Mode" (RM), power is not applied to the P-Channel MOSFET 122. The N-Channel power MOSFET 120 functions as a low-side switch, enabling the N-Channel power MOSFET 120 to sink current from an externally connected circuit. In this mode, the controller 100 outputs may be used to drive varying types of loads with the only limitation being the maximum allowable power dissipation through the semiconductor.

When the output stage 118 is switched over into the second mode, "Logic Mode", a supply power input (e.g. 5V) is then applied to the P-Channel MOSFET 122, and the output stage 118 performs as a TTL/CMOS compatible push-pull output stage, capable of sourcing up to 200 mA of output current to drive external logic circuitry. In certain embodiments, the logic supply voltage can be adjusted to support both 3.3V and 5V logic-level outputs. However, the output load is not limited to just logic gates as the output stage 118 can drive any load providing that the maximum output current between all three channels does not exceed 400 mA.

A digital circuit breaker circuit 124 performs at least two tasks for the output stage 118. First, the breaker circuit 124 functions as a switch for the logic voltage rail (e.g. 5V) that supplies power to each of the output stages 118 associated with each of the channels of the controller 100 (e.g. when the controller 100 is in Logic Mode). The breaker circuit 124 also monitors the maximum current flow (i.e. current sense) from the supply to the output stage 118 to protect the supply from short circuits or an overload condition which could cause damage to the controller 100. As a non-limiting example, to facilitate current detection, a low-value resistor (not shown) is electrically coupled in series with the supply rail and the breaker circuit 124 monitors the voltage drop across the "sense" resistor. If the voltage drive rises above a pre-defined value, the logic voltage rail is shut down for a pre-determined period of time and then periodically reconnected to test for the removal of the overcurrent/short circuit condition. If the output still remains in the fault condition, the breaker circuit 124 continuously makes and breaks the connection to the logic voltage rail resulting in a pulsed output which minimizes power dissipation through the output stage 118 until the overload/short circuit is removed.

A driver circuit 126 is in electrical communication with at least the N-channel power MOSFET 120 to provide a switching voltage to a gate of the N-channel power MOSFET 120. As a non-limiting example, the driver circuit 126 includes a high power MOSFET driver chip such as the IXDD414 or other suitable integrated circuit. The driver circuit 126 also includes the necessary bypass capacitors and protection diodes (not shown) to maximize the speed at which a gate of the N-channel power MOSFET 120 is charged and discharged. With proper layout techniques taken into consideration, the N-channel power MOSFET 120 can be switched up to a pre-determined maximum frequency (e.g. 5 MHz), though proper thermal management must be employed to keep the N-channel power MOSFET 120 within a reasonable temperature range.

In certain embodiments, the P-Channel MOSFET 122 is not connected to the output of the driver circuit 126 as the P-Channel MOSFET 122 only requires 5V logic-level signals to switch an associated gate "on" and "off", while the driver circuit 126 delivers a minimum of 12V to the gate of the N-Channel power MOSFET 120 to minimize the turn-on time thereof.

In certain embodiments, the controller 100 includes a cooling fan (not shown) capable of moving air with a minimum flow-rate of 70 cfm (cubic feet per minute). The hottest part of the controller 100 is the center of the circuit board. An appropriate cooling fan should be installed such that air is pulled from the sides of the enclosure and ejected from the enclosure from the top. A pluggable terminal block is provided for convenience to make connections to the application circuitry though alternative connectors and/or plugs can be employed to suit the application.

In certain embodiments, the controller 100 generally performs according to the following specifications:

| Parameter | Test Conditions | Min | Typ | Max | Units |
|---|---|---|---|---|---|
| Supply Voltage | | 12 | 15 | 38 | V |
| Supply Current | All channels off, $V_{in} = 12$ V | | 280 | | mA |
| USB Isolation Voltage | | 1.5 | | | kV |
| Kill switch Input Logic High | | 3 | 5 | 18 | V |
| Kill switch Input Logic Low | | 0 | 0 | 2.7 | V |
| Operating Frequency Range | | 5 | | $5*10^6$ | Hz |
| Minimum Pulse Width | | 80 | | | ns |
| Operating Temperature | | 0 | 20 | 85 | °C. |
| Switch Voltage | | | | 1500 | V |
| Switch Power Dissipation | | | | 1 | W |

With regard to the above table, the minimum pulse width is stated when the controller 100 is operating in high frequency mode (f-out≥14.65 kHz). When the controller 100 is operating at lower frequencies, the minimum pulse width increases to 3.26 μs. The switching voltage is based upon a 1500V IGBT. When using alternative IGBTs/MOSFETs in the internal output stage, the maximum voltage is dependant on the rating of the IGBT/MOSFET used. The switch power dissipation rating is specified for the 1500V IGBTs with no additional heat sink added. Heat dissipation can be maximized with the addition of a heatsink by the user and adequate cooling.

The controller 100 includes: three digitally controlled channels which can be run synchronously or asynchronously with each other; a frequency range of 5 Hz to 5 MHz (certain embodiments have outputs of 0.01 Hz to 25 MHz); a phase control between channels of 0° to 360° with delay resolution down to 1.05 ns per step or less; and a pulse width control from 50 ns up.

The output stage 118 is operated from a regulated switching supply (e.g. 12V to 18V). The components (e.g. the MOSFETs 120, 122 and the driver circuit 126) of the output stage 118 are socketed for easy replacement. A user has selective access to a drain of each of the MOSFETs 120, 122, and ground of each channel on an output terminal connector. In certain embodiments, an aux 5V TTL/CMOS computable digital output is available from the same output connections for driving external components.

In certain embodiments, a High-voltage (HV) transient suppression protection circuitry is installed in the controller 100 to protect against HV discharges. The components (e.g. the MOSFETs 120, 122 and the driver circuit 126) of the output stage 118 are individually protected against transients higher than 1500V. The controller 100 also includes a galvanically Isolated USB input for PC connection.

The following peripherals are non-limiting examples of devices that can be connected the controller 100 for intercommunication and control: a data-logging multimeter for monitoring voltage, current, temperature, and other measurable parameters; an external control panel to modify output parameters without computer connected; a three and four-phase sine wave output board; a programmable DC power supply; a motor control module; and a sensor module.

The controller 100 provides a PC Control of all channels frequency, phase, a pulse width/duty cycle, an Enable/Disable Kill switch feature, a preset fault response, and an embedded VBScript/JavaScript scripting which allows custom control algorithms and macros. In certain embodiments, a PC software provides support for one or more external serial multimeters for reading in real-time current and voltage values. The controller 100 further has the capability to upgrade firmware via a USB connection or wireless port (e.g. Bluetooth® and the like). It is understood that an ActiveX Control can also be included for software development. It is further understood that a command line support can be included for command execution from outside programs.

From the foregoing description, one ordinarily skilled in the art can easily ascertain the essential characteristics of this invention and, without departing from the spirit and scope thereof, make various changes and modifications to the invention to adapt it to various usages and conditions.

What is claimed is:

1. A relay device comprising:
an isolated power supply configured to receive a voltage input and generate a voltage output based upon the voltage input;
an isolator configured to receive an input signal and generate an isolated output signal based upon the input signal;
at least one switch; and
a driver in electrical communication with the isolated power supply, the isolator, and the at least one switch for controlling the at least one switch in response to the isolated output signal, wherein the driver receives the voltage output from the isolated power supply as an operating voltage and receives the isolated output signal directly from the isolator.

2. The relay according to claim 1, wherein the isolated power supply is a direct current to direct current converter.

3. The relay according to claim 1, wherein the isolator is a photocoupler.

4. The relay according to claim 1, wherein the at least one switch is a transistor and the driver is electrically coupled to a gate of the transistor.

5. The relay according to claim 1, further comprising a heat sink in thermal communication with the at least one switch.

6. The relay according to claim 1, wherein the at least one switch is a transistor releaseably coupled to a transistor socket.

7. A multi-channel pulse controller comprising:
an output stage in signal communication with at least one of the channels of the controller, the output stage including at least a pair of transistors to selectively operate in at least a relay mode and a logic mode;
a microcontroller having at least one pulse width modulator in signal communication with the output stage to generate at least one output pulse and transmit the at least one output pulse to the output stage;
a buffer circuit in signal communication with the output stage and the microcontroller to provide electrical protection between the output stage and the microcontroller; and
a kill switch circuit in signal communication with the buffer circuit to selectively prevent the buffer circuit from passing the at least one output pulse from the microcontroller to the output stage.

8. The multi-channel pulse controller according to claim 7, wherein the output stage further comprises a driver circuit in electrical communication with at least one of the transistors of the pair of transistors to apply a minimum gate voltage of 12 volts.

9. The multi-channel pulse controller according to claim 7, wherein one of the pair of transistors is a P-channel transistor and another of the pair of transistors is an N-channel power transistor.

10. The multi-channel pulse controller according to claim 7, further comprising a fine delay adjustment circuit in communication with the microcontroller to maximize a phase resolution of the at least one output pulse.

11. The multi-channel pulse controller according to claim 7, further comprising an interface in signal communication with the microcontroller, whereby a peripheral device in communication with the interface selectively controls an operation of the microcontroller.

12. The multi-channel pulse controller according to claim 11, wherein the interface is an isolated universal serial bus interface.

13. The multi-channel pulse controller according to claim 7, further comprising a kill switch trigger input in signal communication with the kill switch circuit, wherein a peripheral device in communication with the kill switch trigger input selectively controls an operation of the kill switch circuit.

14. The multi-channel pulse controller according to claim 13, wherein the kill switch trigger input is an optocoupler.

15. The multi-channel pulse controller according to claim 7, further comprising a driver circuit in electrical communication with at least one transistor of the pair of transistors of the output stage to provide a pre-determined gate voltage thereto.

16. The multi-channel pulse controller according to claim 7, further comprising a digital circuit breaker circuit in electrical communication with at least one transistor of the pair of transistors of the output stage to operate as a voltage switch.

17. A relay device comprising:
an isolated power supply configured to receive a voltage input and generate a voltage output based upon the voltage input;
an isolator configured to receive an input signal and generate an isolated output signal based upon the input signal;
at least one switch;

a driver in electrical communication with the isolated power supply, the isolator, and the at least one switch for controlling the at least one switch in response to the isolated output signal, wherein the driver receives the voltage output from the isolated power supply as an operating voltage; and a controller in signal communication with the isolator to generate and transmit the input signal thereto, the controller further comprising:

an output stage including at least a pair of transistors to generate the input signal; and a microcontroller having at least one pulse width modulator in signal communication with the output stage to generate at least one output pulse and transmit the at least one output pulse to the output stage to control at least one of the pair of transistors.

18. The relay device according to claim 17, further comprising a buffer circuit in signal communication with the output stage and the microcontroller to provide electrical protection between the output stage and the microcontroller.

19. The relay device according to claim 17, further comprising a kill switch circuit in signal communication with the buffer circuit to selectively prevent the buffer circuit from passing the at least one output pulse from the microcontroller to the output stage.

20. The relay device according to claim 17, further comprising a driver circuit in electrical communication with at least one transistor of the pair of transistors of the output stage to provide a pre-determined gate voltage thereto.

* * * * *